(12) United States Patent
Satake et al.

(10) Patent No.: US 7,840,390 B2
(45) Date of Patent: Nov. 23, 2010

(54) CREATING METHOD OF SIMULATION MODEL, MANUFACTURING METHOD OF PHOTO MASK, MANUFACTURING METHOD OF SEMICONDUCTOR DEVICE, AND RECORDING MEDIUM

(75) Inventors: Masaki Satake, Yokohama (JP); Shoji Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 603 days.

(21) Appl. No.: 11/806,174

(22) Filed: May 30, 2007

(65) Prior Publication Data
US 2008/0004852 A1    Jan. 3, 2008

(30) Foreign Application Priority Data
Jun. 2, 2006    (JP) .............................. 2006-155142

(51) Int. Cl.
    *G06F 17/10* (2006.01)
(52) U.S. Cl. .............................. 703/2; 703/13; 716/20; 716/21
(58) Field of Classification Search ...................... 703/2, 703/13, 14; 716/19–21
    See application file for complete search history.

(56) References Cited

U.S. PATENT DOCUMENTS

| | | | |
|---|---|---|---|
| 7,026,081 B2 * | 4/2006 | Van Den Broeke et al. | ... 430/30 |
| 7,399,559 B2 * | 7/2008 | Broeke et al. | ................... 430/5 |
| 7,588,868 B2 * | 9/2009 | Zach et al. | ..................... 430/22 |

FOREIGN PATENT DOCUMENTS

JP    2006-126532    5/2006

OTHER PUBLICATIONS

Cobb, N. et al., "Mathematical and CAD Framework for Proximity Correction," SPIE, vol. 2726, pp. 208-221, (1996).

* cited by examiner

*Primary Examiner*—Russell Frejd
(74) *Attorney, Agent, or Firm*—Finnegan, Henderson, Farabow, Garrett & Dunner, L.L.P.

(57) ABSTRACT

A method of creating a simulation model, includes acquiring a CD value of a photoresist pattern actually formed based upon a test pattern, acquiring information about a shape of the photoresist pattern, acquiring an intensity distribution of an optical image based upon the test pattern by performing simulation, acquiring an empirical threshold defined according to a CD value on the intensity distribution, which corresponds to the CD value of the photoresist pattern, acquiring a parameter of the optical image based upon the intensity distribution of the optical image, acquiring a first correlation between the information about the shape of the photoresist pattern and the parameter of the optical image, acquiring a second correlation between the information about the shape of the photoresist pattern and the empirical threshold, and acquiring a third correlation between the parameter of the optical image and the empirical threshold by using first and second correlations.

13 Claims, 7 Drawing Sheets

CREATING METHOD OF SIMULATION MODEL, MANUFACTURING METHOD OF PHOTO MASK, MANUFACTURING METHOD OF SEMICONDUCTOR DEVICE, AND RECORDING MEDIUM

CROSS-REFERENCE TO RELATED APPLICATIONS

This application is based upon and claims the benefit of priority from prior Japanese Patent Application No. 2006-155142, filed Jun. 2, 2006, the entire contents of which are incorporated herein by reference.

BACKGROUND OF THE INVENTION

1. Field of the Invention

The present invention relates to a method of creating a simulation model and the like.

2. Description of the Related Art

According to advance of a semiconductor integrated circuit to high integration, lithography simulation becomes important increasingly. In order to perform lithography simulation with high precision, it is important to use a simulation model with a high precision.

For creating a lithography simulation model, it is necessary to optimize a parameter for the lithography simulation model so as to reduce a size difference between a line width (experimental value) of a photoresist pattern formed actually and a line width (simulation value) obtained by a simulation. As the method for optimizing a parameter for a lithography simulation model, methods using a regression analysis has been known (for example, see "SPIE vol. 2726, p. 209-221, Mar. 13, 1996").

As one of the methods using a regression analysis, there is a method for determining a function representing a correlation between a parameter of an optical image and an empirical threshold according to a regression analysis. The parameter of an optical image influences a shape or a size of a photoresist pattern. For example, a slope of an intensity distribution of an optical image can be used as the parameter for an optical image. The empirical threshold is an intensity value defined according to a CD value on an intensity distribution of an optical image.

However, when a number of various test patterns are used for improving precision of a simulation model, such a problem that a clear correlation cannot be found between a parameter of an optical image and an empirical threshold, such a problem that the correlation between a parameter of an optical image and an empirical threshold lowers occurs. In such a case, precision of the lithography simulation will deteriorate.

Thus, when a lithography simulation model is created using the regression analysis, there is such a problem that a clear correlation cannot be found between a parameter of an optical image and an empirical threshold, or such a problem that the correlation between a parameter of an optical image and an empirical threshold lowers. Therefore, it was conventionally difficult to obtain a simulation model with a high precision.

BRIEF SUMMARY OF THE INVENTION

A first aspect of the present invention, there is provide a method of creating a simulation model, comprising: acquiring a CD value of a photoresist pattern actually formed based upon a test pattern; acquiring information about a shape of the photoresist pattern; acquiring an intensity distribution of an optical image based upon the test pattern by performing simulation; acquiring an empirical threshold defined according to a CD value on the intensity distribution, which corresponds to the CD value of the photoresist pattern; acquiring a parameter of the optical image based upon the intensity distribution of the optical image; acquiring a first correlation between the information about the shape of the photoresist pattern and the parameter of the optical image; acquiring a second correlation between the information about the shape of the photoresist pattern and the empirical threshold; and acquiring a third correlation between the parameter of the optical image and the empirical threshold by using the first correlation and the second correlation.

A second aspect of the present invention, there is provide a computer readable medium configured to store program instructions for execution on a computer, the program instructions causing the computer to perform: storing a CD value of a photoresist pattern actually formed based upon a test pattern; storing information about a shape of the photoresist pattern; acquiring an intensity distribution of an optical image based upon the test pattern by performing simulation; acquiring an empirical threshold defined according to a CD value on the intensity distribution, which corresponds to the CD value of the photoresist pattern; acquiring a parameter of the optical image based upon the intensity distribution of the optical image; acquiring a first correlation between the information about the shape of the photoresist pattern and the parameter of the optical image; acquiring a second correlation between the information about the shape of the photoresist pattern and the empirical threshold; and acquiring a third correlation between the parameter of the optical image and the empirical threshold by using the first correlation and the second correlation.

DETAILED DESCRIPTION OF THE INVENTION

An embodiment of the present invention will be explained below with reference to the drawings.

Figure 1:
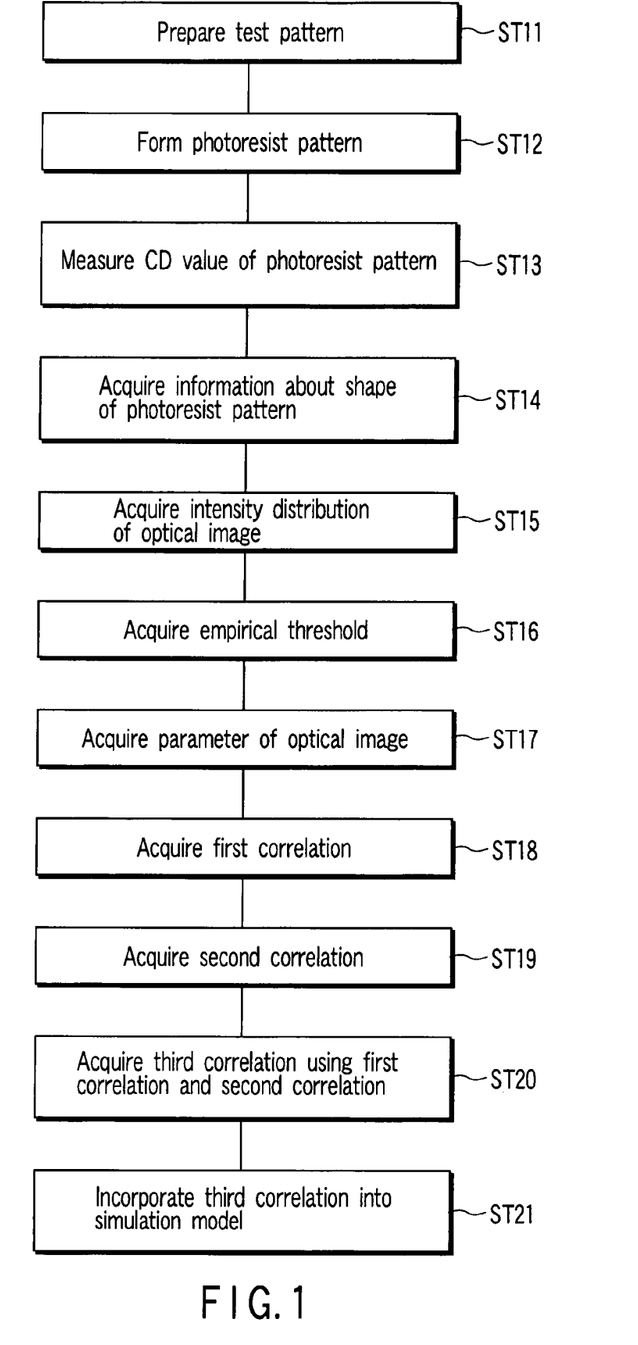
FIG. 1 is a flowchart showing a creating method of a lithography simulation model according to an embodiment of the present invention.
Figure 2:
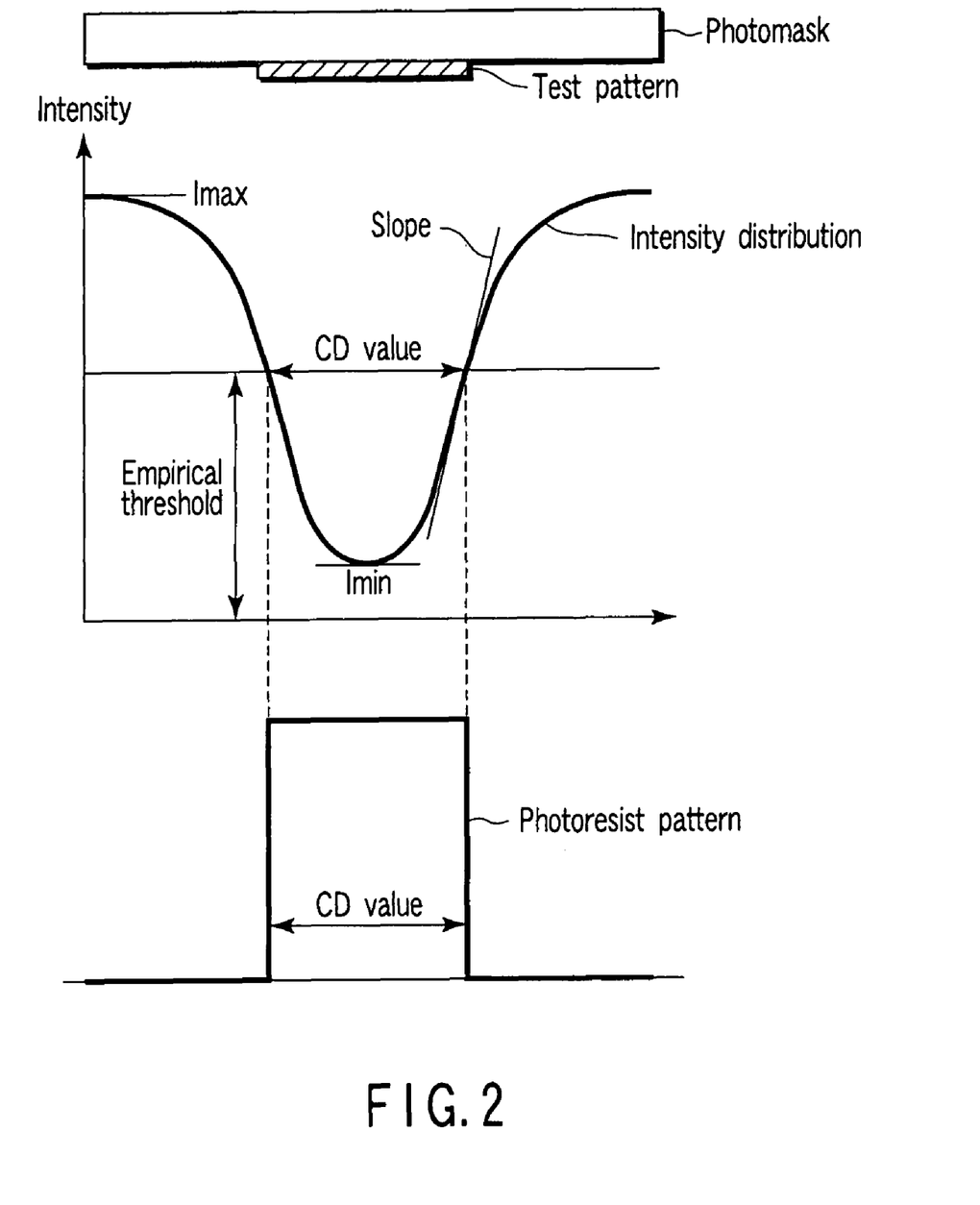
FIG. 2 is an explanatory diagram for explaining the creating method of a lithography simulation model according to the embodiment of the present invention.

FIG. 1 is a flowchart showing a creating method of a lithography simulation model according to an embodiment of the present invention. FIG. 2 is an explanatory diagram for explaining a creating method of a lithography simulation model according to the embodiment.

First, a plurality of kinds of test patterns with different line widths or the like are prepared (ST11). Then, test patterns formed on a photomask are projected on a photoresist film. Further, photoresist patterns are actually formed according to developing processing (ST12). Subsequently, a CD (Critical Dimension) value of each photoresist pattern is measured (ST13). That is, as shown in FIG. 2, a line width of each photoresist pattern is measured. The CD value (line width) can be obtained, for example, from an SEM image of a photoresist pattern. The acquired CD value is stored in a predetermined storage area.

Figure 3A:
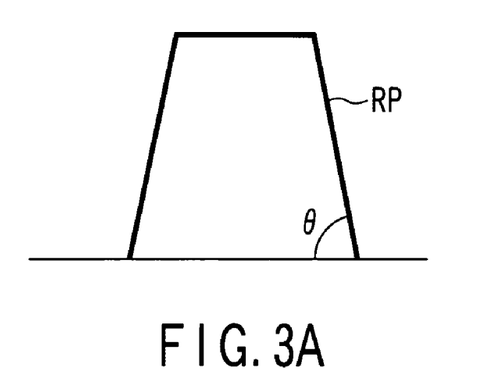
FIGS. 3A to 3D are diagrams showing information about a shape of a photoresist pattern according to the embodiment of the present invention.
Figure 3B:
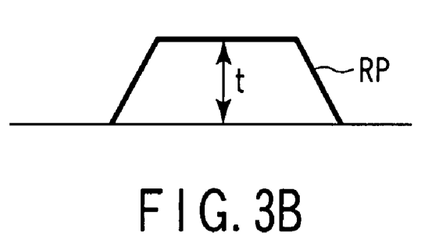
Figure 3C:
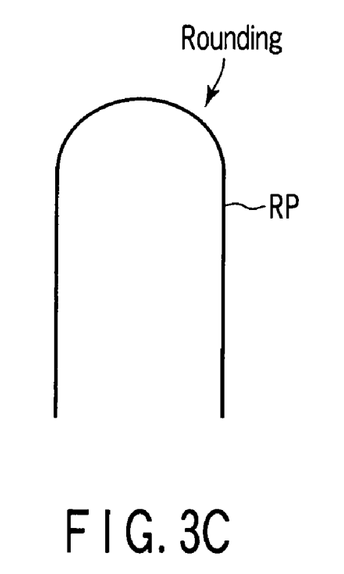
Figure 3D:
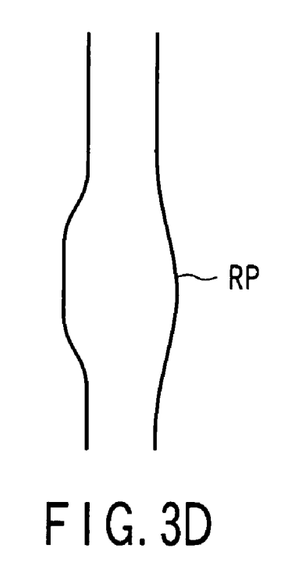

Next, information about a shape of each photoresist pattern is acquired, for example, from the SEM image of a photoresist pattern (ST14). The acquired information is stored in a predetermined storage area. FIG. 3A to FIG. 3D are diagrams showing information about a shape of a photoresist pattern. The information about a shape of a photoresist pattern includes at least one of a taper angle θ of a sidewall of a photoresist pattern RP (FIG. 3A), a thickness t of the photoresist pattern RP (FIG. 3B), a rounding of an end portion of the photoresist pattern RP (FIG. 3C), a line edge roughness LER of the photoresist pattern (FIG. 3D), and a line width roughness LWR of the photoresist pattern (FIG. 3D). In the present embodiment, the taper angle θ of a sidewall of the photoresist pattern RP is used as the information about a shape of a photoresist pattern.

Next, an intensity distribution of an optical image based upon each test pattern is obtained from a simulation (ST15). That is, as shown in FIG. 2, an intensity distribution of an optical image on a photoresist film obtained when a test pattern formed on the photo mask is projected onto the photoresist film is obtained according to simulation.

Next, an empirical threshold shown in FIG. 2 is obtained regarding an intensity distribution of an optical image based upon each test pattern (ST16). This empirical threshold is defined according to a CD value on the intensity distribution of an optical image, which corresponds to a CD value of a photoresist pattern. That is, as shown in FIG. 2, when the CD value of the photoresist pattern is determined, the CD value on the intensity distribution of an optical image is determined. An intensity value defined by the CD value on the intensity distribution of an optical image is determined. This intensity value corresponds to the empirical threshold.

Next, a parameter of an optical image is obtained based upon the intensity distribution of an optical image (ST17). The parameter of an optical image influences a shape or a size of a photoresist pattern. The parameter of an optical image includes at least one of a slope of an intensity distribution of an optical image, a minimum value Imin of an intensity distribution of an optical image, and a maximum value Imax of an intensity distribution of an optical image, for example, as shown in FIG. 2. In the present embodiment, the slope of an intensity distribution of an optical image is used as the parameter of an optical image.

Figure 4:
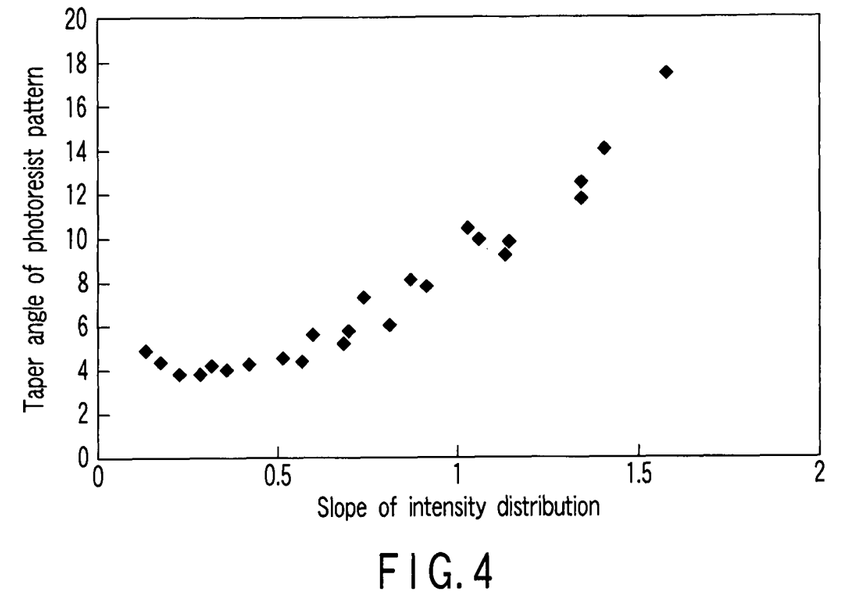
FIG. 4 is a diagram on which a relationship between the information about a shape of a photoresist pattern and a parameter of an optical image is plotted according to the embodiment of the present invention.
Figure 5:
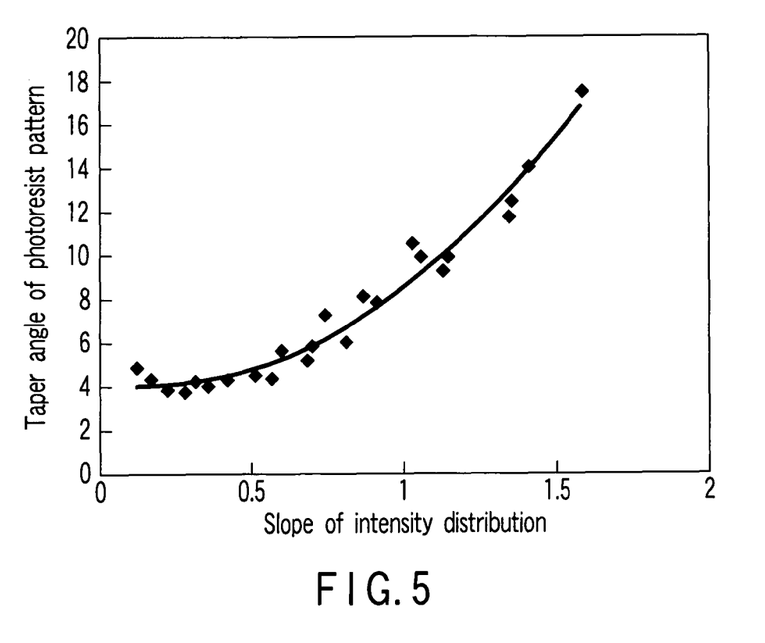
FIG. 5 is a diagram showing a function obtained by regression analysis of the plot result in FIG. 4 according to the embodiment of the present invention.

Next, correlation (first correlation) between information about a shape of a photoresist pattern (a taper angle of a sidewall of a photoresist pattern, in the present embodiment) and a parameter of an optical image (a slope of an intensity distribution of an optical image, in the present embodiment) is obtained (ST18). As shown in FIG. 4, a relationship between a taper angle of a sidewall of a photoresist pattern and a slope of an intensity distribution of an optical image is plotted with respect to each of a plurality of test patterns. As understood from FIG. 4, the correlation between the taper angle and the slope is high. Since a solubility of photoresist changes according to light intensity, it is thought that the taper angle of the photoresist pattern changes according to the slope of intensity distribution of an optical image. Substantially, as shown in FIG. 5, a function representing correlation between the taper angle and the slope is obtained based upon the plot result in FIG. 4 according to regression analysis. In the present embodiment, since there is one point of inflection, the correlation between the taper angle and the slope is expressed by a quadratic function.

Figure 6:
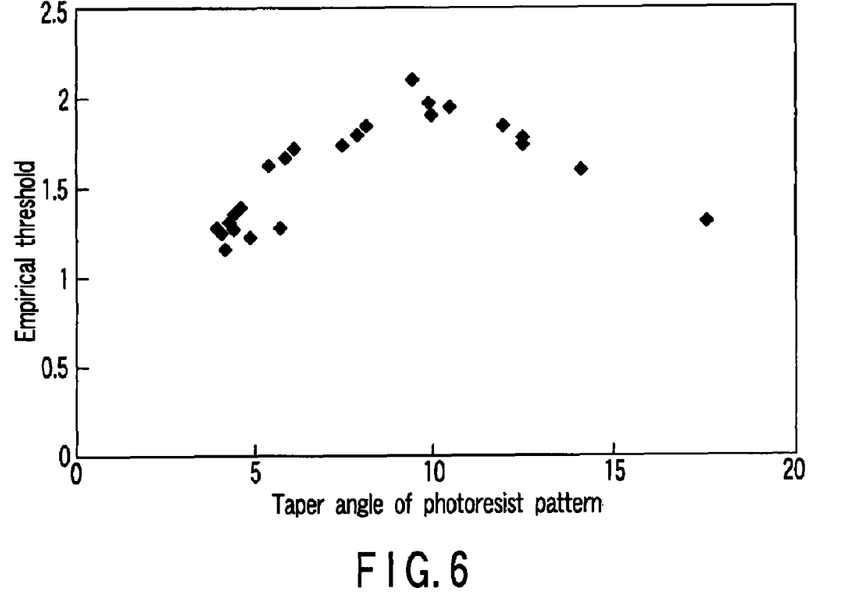
FIG. 6 is a diagram on which a relationship between the information about a shape of a photoresist pattern and an empirical threshold is plotted according to the embodiment of the present invention.
Figure 7:
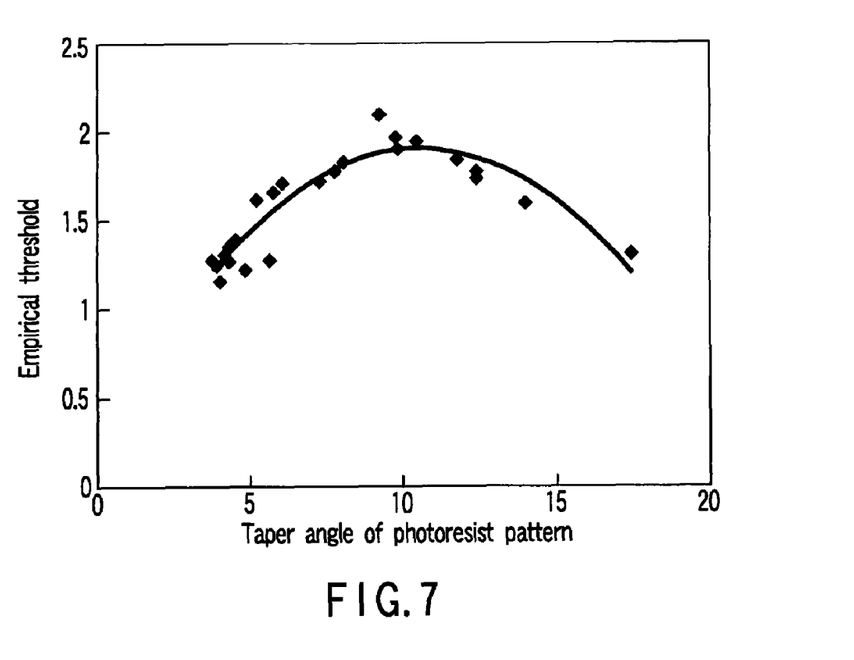
FIG. 7 is a diagram showing a function obtained by regression analysis of the plot result in FIG. 6 according to the embodiment of the present invention.

Next, correlation (second correlation) between the information about a shape of a photoresist pattern (a taper angle of a sidewall of a photoresist pattern, in the present embodiment) and an empirical threshold is obtained (ST19). As shown in FIG. 6, a relationship between a taper angle of a sidewall of a photoresist pattern and an empirical threshold is plotted with respect to each of a plurality of test patterns. As understood from FIG. 6, the correlation between the taper angle and the empirical threshold is high. It is thought that a measurement value of a line width of a photoresist pattern changes according to the taper angle of the photoresist pattern, and the empirical threshold changes. Substantially, as shown in FIG. 7, a function representing correlation between the taper angle and the empirical threshold is obtained based upon the plot result in FIG. 6 according to regression analysis. In the present embodiment, since there is one point of inflection, the correlation between the taper angle and the empirical threshold is expressed by a quadratic function.

Figure 8:
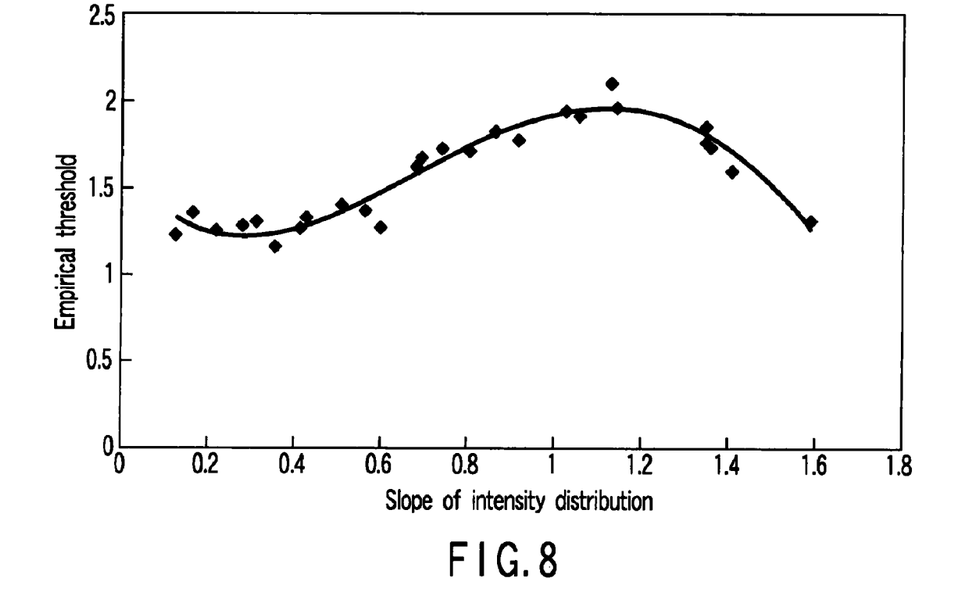
FIG. 8 is a diagram showing a function representing correlation between a parameter of an optical image and an empirical threshold according to the embodiment of the present invention.

Next, correlation (third correlation) between the parameter of an optical image (a slope of an intensity distribution of an optical image, in the present embodiment) and the empirical threshold is obtained using the first correlation obtained at step ST18 and the second correlation obtained at step ST19 (ST20). As described above, the first correlation obtained at step ST18 is expressed as a quadratic function. The second correlation obtained at step ST19 is also expressed as a quadratic function. Accordingly, a third correlation obtained from the first correlation and the second correlation is expressed as a quartic function, as shown in FIG. 8. Incidentally, in FIG. 8, a relationship between the parameter of an optical image (slope of an intensity distribution of an optical image) and the empirical threshold is also plotted with respect to each of the plurality of test patterns, from which it is understood that the quartic function is shown along the plot.

Figure 9:
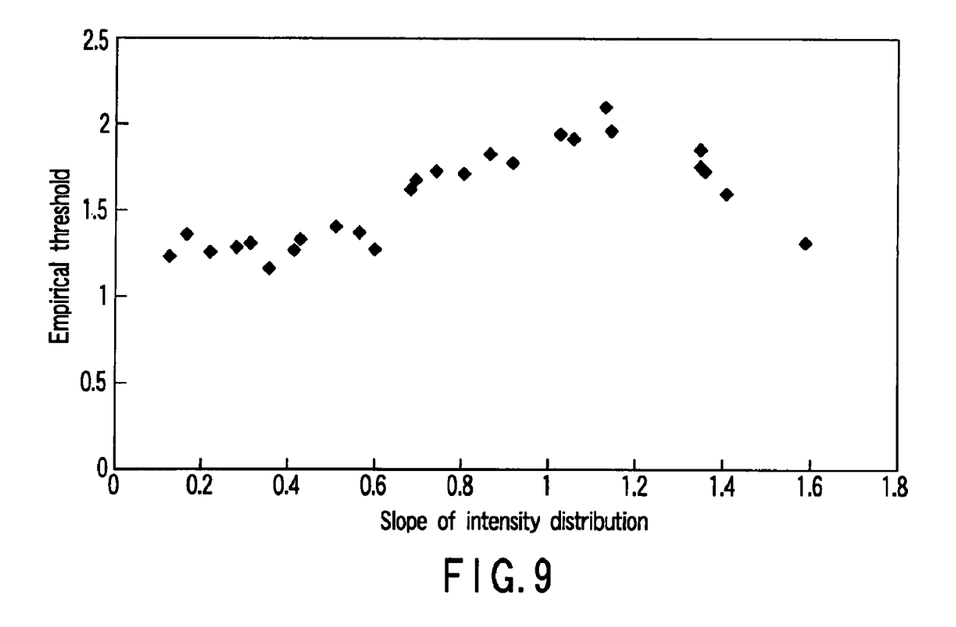
FIG. 9 is a diagram on which a relationship between a parameter of an optical image and an empirical threshold is plotted according to a comparative example of the embodiment of the present invention.
Figure 10:
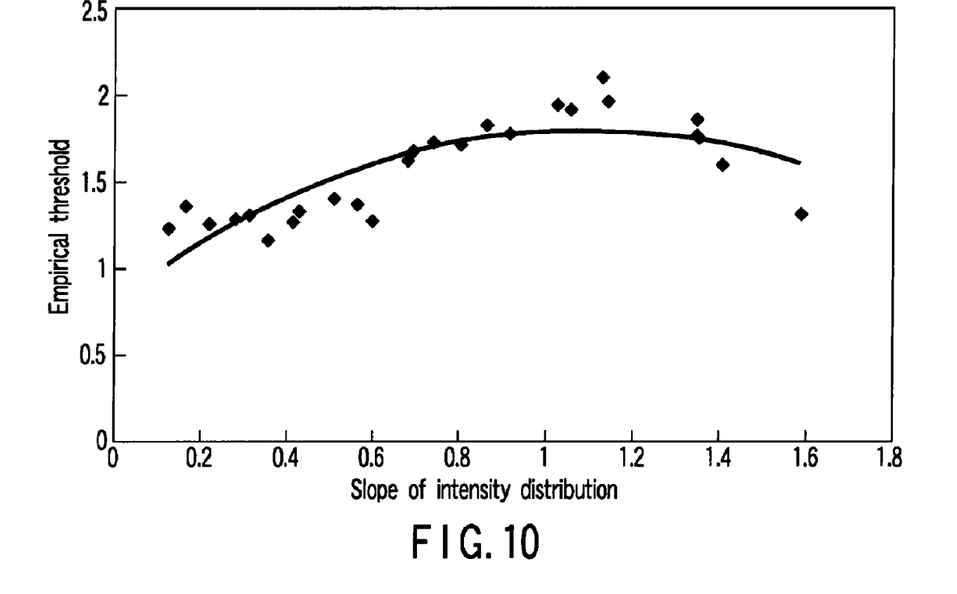
FIG. 10 is a diagram showing a function obtained by regression analysis of the plot result in FIG. 9 according to the comparative example of the embodiment of the present invention.

FIG. 9 and FIG. 10 are diagrams showing a comparative example to the present embodiment. FIG. 9 is a diagram showing only the plot shown in FIG. 8. As understood from FIG. 9, correlation between the slope of an intensity distribution of an optical image and an empirical threshold is not so high, where one point of inflection is observable. Therefore, if regression analysis is performed based upon a plot result in FIG. 9, correlation between the slope of an intensity distribution of an optical image and the empirical threshold represents a quadratic function, as shown in FIG. 10. That is, a quartic function can not be obtained unlike the present embodiment.

Next, the third correlation (correlation expressed by a quartic function) obtained at step ST20 is incorporated in a simulation model (ST21). Thereby, a simulation model incorporated with the correlation between the parameter of the optical image (the slope of an intensity distribution of an optical image, in the present embodiment) and the empirical threshold with high precision can be obtained.

As described above, in the present embodiment, the correlation (the first correlation) between the information about a shape of a photoresist pattern (for example, the taper angle of a sidewall of a photoresist pattern) and the parameter of an optical image (for example, the slope of an intensity distribution of an optical image) is obtained and the correlation (the second correlation) between the information about a shape of a photoresist pattern and the empirical threshold is obtained. The correlation (the third correlation) between the parameter of an optical image and the empirical threshold is obtained using the first correlation and the second correlation. By using such a method, the correlation between the parameter of an optical image and the empirical threshold can be obtained with high precision. That is, even if clear correction can not be found between the parameter of an optical image and the empirical threshold or even if correlation between the parameter of an optical image and the empirical threshold is low, when the first correlation and the second correlation are high, the correlation (the third correlation) between the parameter of an optical image and the empirical threshold can be obtained with high precision. Accordingly, by using the method according to the present embodiment, a simulation model with high precision can be created.

Incidentally, the evaluating method of a simulation model described above can be applied to a manufacturing method of a semiconductor device.

Figure 11:
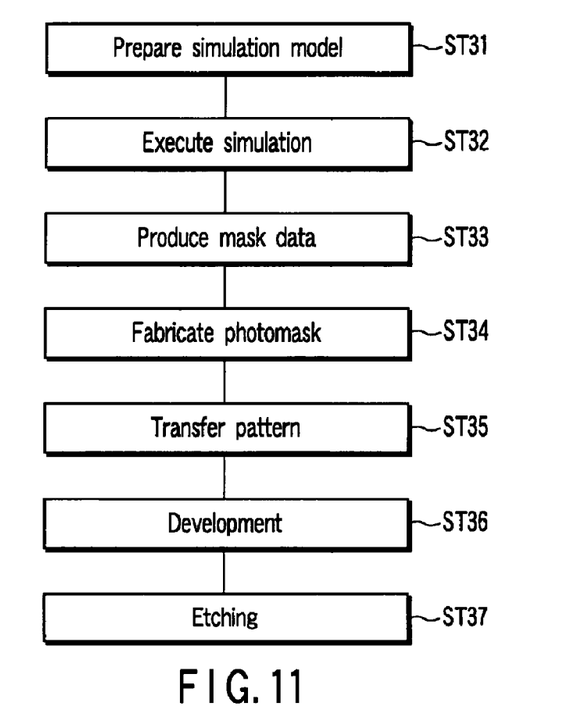
FIG. 11 is a flowchart showing an outline of a manufacturing method of a semiconductor device according to the embodiment of the present invention.

FIG. 11 is a flowchart showing the manufacturing method of a semiconductor device.

First, a simulation model is created using the method according to the embodiment described above (ST31). Subsequently, a lithography simulation is performed using the created simulation model (ST32). Then, mask data is generated from design data based upon a guideline obtained by the lithography simulation (ST33). A photomask is fabricated based upon the generated mask data (ST34). A pattern formed on the photomask thus fabricated is transferred onto a photoresist on a semiconductor wafer (ST35). A photoresist pattern is formed by developing the photoresist (ST36). Further, etching is performed using the photoresist pattern as a mask to form a pattern on the semiconductor wafer (ST37).

In addition, the method described in the embodiment can be realized by a computer whose operation is controlled by a program on which a procedure of the method has been described. The program can be provided by a recording medium such as a magnetic disk.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of creating a simulation model, comprising:
    acquiring, by a computer, a CD value of a photoresist pattern actually formed based upon a test pattern;
    acquiring, by the computer, information about a shape of the photoresist pattern;
    acquiring, by the computer, an intensity distribution of an optical image based upon the test pattern by performing simulation;
    acquiring, by the computer, an empirical threshold defined according to a CD value on the intensity distribution, which corresponds to the CD value of the photoresist pattern;
    acquiring, by the computer, a parameter of the optical image based upon the intensity distribution of the optical image;
    acquiring, by the computer, a first correlation between the information about the shape of the photoresist pattern and the parameter of the optical image;
    acquiring, by the computer, a second correlation between the information about the shape of the photoresist pattern and the empirical threshold; and
    acquiring, by the computer, a third correlation between the parameter of the optical image and the empirical threshold by using the first correlation and the second correlation.

2. The method according to claim 1, wherein the information about the shape of the photoresist pattern includes at least one of a taper angle of a sidewall of the photoresist pattern, a thickness of the photoresist pattern, rounding of the photoresist pattern, line edge roughness of the photoresist pattern, and line width roughness of the photoresist pattern.

3. The method according to claim 1, wherein
    the parameter of the optical image includes at least one of a slope of the intensity distribution of the optical image, a minimum value of the intensity distribution of the optical image, and a maximum value of the intensity distribution of the optical image.

4. The method according to claim 1, wherein
    the parameter of the optical image influences at least one of a shape and a size of a photoresist pattern.

5. The method according to claim 1, wherein
    the first correlation between the information about the shape of the photoresist pattern and the parameter of the optical image is obtained by regression analysis.

6. The method according to claim 1, wherein
    the second correlation between the information about the shape of the photoresist pattern and the empirical threshold is obtained by regression analysis.

7. The method according to claim 1, further comprising:
    acquiring, by the computer, an image of the photoresist pattern.

8. The method according to claim 7, wherein the CD value of the photoresist pattern is acquired from the image of the photoresist pattern.

9. The method according to claim 7, wherein
    the information about the shape of the photoresist pattern is acquired from the image of the photoresist pattern.

10. The method according to claim 1, wherein
    the CD value of the photoresist pattern includes a line width.

11. A method of manufacturing a photomask, comprising:
fabricating the photomask based upon a guideline obtained by the simulation model created by the method according to claim 1.

12. A method of manufacturing a semiconductor device, comprising:
fabricating a photomask based upon a guideline obtained by the simulation model created by the method according to claim 1; and
transferring a pattern formed on the photomask onto a photoresist on a semiconductor wafer.

13. A computer readable medium configured to store program instructions for execution on a computer, the program instructions causing the computer to perform:
storing a CD value of a photoresist pattern actually formed based upon a test pattern;
storing information about a shape of the photoresist pattern;
acquiring an intensity distribution of an optical image based upon the test pattern by performing simulation;
acquiring an empirical threshold defined according to a CD value on the intensity distribution, which corresponds to the CD value of the photoresist pattern;
acquiring a parameter of the optical image based upon the intensity distribution of the optical image;
acquiring a first correlation between the information about the shape of the photoresist pattern and the parameter of the optical image;
acquiring a second correlation between the information about the shape of the photoresist pattern and the empirical threshold; and
acquiring a third correlation between the parameter of the optical image and the empirical threshold by using the first correlation and the second correlation.

* * * * *